(12) United States Patent
Tao et al.

(10) Patent No.: US 8,847,631 B2
(45) Date of Patent: Sep. 30, 2014

(54) HIGH SPEED LOW LOSS GATE DRIVE CIRCUIT

(75) Inventors: Fengfeng Tao, Clifton Park, NY (US); Seyed Gholamali Saddoughi, Clifton Park, NY (US); John Thomas Herbon, Loveland, OH (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/336,669

(22) Filed: Dec. 23, 2011

(65) Prior Publication Data
US 2013/0162322 A1 Jun. 27, 2013

(51) Int. Cl.
*H03K 3/00* (2006.01)

(52) U.S. Cl.
USPC ........... 327/108; 327/110; 327/392; 327/399; 327/423; 327/494

(58) Field of Classification Search
USPC ......... 327/108, 110, 392, 394, 399, 423–424, 327/427, 430, 432, 494, 587
See application file for complete search history.

(56) References Cited

U.S. PATENT DOCUMENTS

| | | | | |
|---|---|---|---|---|
| 6,650,169 B2 * | 11/2003 | Faye et al. | | 327/404 |
| 6,781,423 B1 * | 8/2004 | Knoedgen | | 327/110 |
| 6,911,848 B2 * | 6/2005 | Vinciarelli | | 327/108 |
| 7,285,876 B1 | 10/2007 | Jacobson | | |
| 7,586,333 B1 | 9/2009 | Raghavan et al. | | |
| 7,612,602 B2 * | 11/2009 | Yang et al. | | 327/494 |
| 7,679,395 B1 | 3/2010 | Yang et al. | | |
| 2006/0038547 A1 | 2/2006 | Ahmad | | |
| 2006/0170043 A1 | 8/2006 | Liu et al. | | |
| 2006/0181831 A1 | 8/2006 | Kojima | | |
| 2007/0146020 A1 | 6/2007 | Williams | | |
| 2008/0122497 A1 | 5/2008 | Ishikawa et al. | | |
| 2009/0206817 A1 | 8/2009 | Ng et al. | | |
| 2011/0018593 A1 | 1/2011 | Williams | | |
| 2011/0204835 A1 | 8/2011 | Gollentz | | |

FOREIGN PATENT DOCUMENTS

| EP | 2124341 A1 | 11/2009 |
|---|---|---|
| EP | 2164157 A3 | 3/2010 |

OTHER PUBLICATIONS

Takao et al., "Design Consideration of High Power Density Inverter with Low-on-voltage SiC-JBS and High-speed Gate Driving of Si-IGBT", Applied Power Electronics Conference and Exposition, 2009. APEC 2009. Twenty-Fourth Annual IEEE, ISSN : 1048-2334, on pp. 397-400, References Cited: 5, Issue Date : Feb. 15-19, 2009.
EP2164157 (A2) English Abstract.
EP2124341 (A1) English Abstract.

* cited by examiner

*Primary Examiner* — An Luu
(74) *Attorney, Agent, or Firm* — Francis T. Coppa

(57) ABSTRACT

A gate drive circuit includes an insulated gate semiconductor switch. A controlled current source is connected to the semiconductor switch gate terminal to provide a gate drive circuit that is responsive to recycled gate charge corresponding to an internal gate capacitance of the insulated gate semiconductor switch.

22 Claims, 8 Drawing Sheets

HIGH SPEED LOW LOSS GATE DRIVE CIRCUIT

This invention was made with Government support under contract number DE-FC26-08NT05868, awarded by the U.S. Department of Energy. The Government has certain rights in the invention.

BACKGROUND

The subject matter of this disclosure relates generally to electronic gate drive circuits and more particularly to a system and method for providing a high speed, low loss gate drive circuit for semiconductor switches such as, without limitation, metal oxide semiconductor field effect transistor (MOSFET) switches, insulated gate bipolar transistor (IGBT) switches, and thyristor switches.

Turn-on and turn-off speeds of some types of semiconductor switches such as MOSFET switches and IGBT switches are disadvantageously limited by R-C circuit elements when employed in conventional voltage source gate drive circuits. Such voltage source gate drive circuits further suffer from lost gate charge.

As shown in FIG. 1, a conventional gate driver circuit 10 is typically implemented in an IC that consists of a pair of N and P-channel low voltage MOSFETs. When the control signal Vsig turns on the upper P-channel MOSFET, a charging current goes from Vc through a gate resistor Rg, internal gate mesh resistance Rg_i, to charge up the gate input capacitance, $C_{ISS}$ ($=C_{gs}+C_{gd}$), of the power switch, SW, causing it turn on. When the control signal Vsig turns off the P-channel switch and turns on the lower N-channel switch, a discharging current discharges the input capacitance thereof and the SW is turned off.

Although the conventional gate driver ICs are easy to use, they usually suffer from two major issues. One issue is related to the gate driver power losses and the other is related to the operation modes of the power switch they drive. Since the resistance is in the charging and discharging path the gate driver loses approximately twice the energy stored in the power switch's input capacitance each time the switch goes through an on and off cycle. Therefore the gate driver power loss is simply proportional to the operation frequency. Nevertheless high frequency operation provides fast transient response, small component size and superior power density.

There is a steady trend to increase converters' switching frequency continuously over the past decades. The gate driver loss becomes a limiting factor when the operation frequency enters MHz region. Thanks to the great demand on the computer and telecommunication power converters, significant efforts have been made to find innovative ways to reduce the gate driver losses. A fair amount of reference papers and patents can be found in literature, such as Steigerwald, Robert L. (Burnt Hills, N.Y.) U.S. Pat. No. 5,010,261, "Lossless gate driver circuit for a high frequency converter," Maksimovic, D.; "A MOS gate drive with resonant transitions," IEEE PESC '91 Record, Page(s): 527-532, Yuhui Chen; etc. "A resonant MOSFET gate driver with efficient energy recovery," IEEE Transactions on Power Electronics, Volume: 19, Issue: 2, 2004, Page(s): 470-477, de Vries, I. D.; "A resonant power MOSFET/IGBT gate driver," IEEE APEC 2002. Page (s): 179-185 vol. 1, Faye, Li, U.S. Pat. No. 6,650,169, "Gate driver apparatus having an energy recovering circuit," Inoshita, Ryousuke (Nishikamo-gun, JP), U.S. Pat. No. 7,091,753, "Gate driving circuit," Omura, Ichiro (Yokohama, JP), U.S. Pat. No. 7,459,945, "Gate driving circuit and gate driving method of power MOSFET," Yang, Zhihua (Kingston, Calif.), Liu, Yan-fei (Kingston, Calif.), U.S. Pat. No. 7,612,602, "Resonant gate drive circuits," etc., to name a few.

The above mentioned references mostly achieve the goal of lowering gate driver losses. They, however, lack a systematic approach to deal with the issues associated with the power switch operation modes where the effects of parasitic components as well as transient and extreme operating conditions are important.

FIG. 2 shows a half-bridge model 20 with important parasitic components included. The half-bridge configuration is widely used in applications such as high power hard or soft switching, high frequency low voltage synchronous rectifier power supplies, and soft switching resonant converters. It also represents a so-called clamped inductive switching model where most MOSFET transistors and high speed drive circuit work in that operating mode.

The turn-off procedure of the power switches can be roughly categorized into four time intervals: 1) turn-off delay interval where $C_{ISS}$ is discharged from its initial value to the Miller plateau level; 2) Miller plateau interval where the drain-to-source voltage rises from $I_D R_{DS(on)}$ to the final $V_{DS}$ (off) level clamped by the body diode of the complementary switch and the gate current is strictly discharging $C_{gd}$; 3) linear interval where the gate voltage resumes falling from $V_{GS,Miller}$ to $V_{th}$ and the drain current of the power switch decreases following the declining of gate-to-source voltage; 4) fully off interval where the $C_{ISS}$ is fully discharged.

The turn-on procedure is back tracking the turn-off steps. It is intuitively obvious that switching losses exist due to high current and high voltage being present in the power device simultaneously for a short period corresponding to the Miller plateau interval when the drain voltage goes through its switching transient and linear interval when the drain current changes responding to the change in the gate voltage. It becomes essential to shorten these two intervals to reduce the switching losses of the power switch.

In practical applications, the effects of parasitic components and dv/dt limits have to be taken into account since the shapes of the current and voltage, as well as the switching times during the switching procedure are altered significantly when the parasitic inductive components come into play. The dv/dt limit of the power switch sets the up speed limit of the switching transient time. The dv/dt limit describes an unintentional turn-on phenomenon caused by the current flowing through the gate-drain capacitor and generating a positive gate-to-source voltage when the drain-to-source voltage rises rapidly. Since the turn-on threshold voltage $V_{th}$ changes with an approximately −7 mV/° C. temperature coefficient, MOSFET transistors are more susceptible to dv/dt when operating at elevated temperature. Therefore the effect of high junction temperature must be taken into account.

As discussed herein, the parasitic inductive components alter the current and voltage waveforms that exhibit a profound effect on switching performance. The most important parasitic inductive components are the source inductance $L_S$ and drain inductance $L_D$ as shown in FIG. 2. The source inductance $L_S$ not only causes the oscillatory spikes observed in most gate drive circuit, it also shows a negative feedback effect whenever the drain current of the device is changing rapidly. This feedback mechanism establishes a delicate balance of gate current and drain di/dt. The drain inductance $L_D$ on the other hand acts as a beneficial turn-on snubber but produces an overshoot in the drain-to-source and an increase in turn-off switching losses.

To further improve gate driver performance, it is important to recognize that gate driver turn-off capability has a more profound impact on the power device switching losses, dv/dt limit and di/dt EMI performance than the turn-on characteristic does, especially in the typical application shown in FIG. 2. In the hard switching case the turn-on speed is usually limited by the turn-off, or reverse recovery speed of the diode, and not by the strength of the gate drive circuit. Therefore, it is beneficial to match the diode switching characteristics.

In a zero-voltage-switching case, the Miller effect is not present since the drain-to-source voltage is practically zero when the gate is turned-on, or the turn-on of power switch starts with the turn-off of the other complementary power switch. The turn-off speed of the power MOSFET on the other side depends almost solely on the gate drive circuit. The gate driver circuit, however, is required to handle the maximum dv/dt that can occur under worst case conditions; for example, most resonant and soft switching converters can force a dv/dt across the power switch right after its turn-off instance due to the power stage resonant components.

It would be both advantageous and beneficial to provide a high speed, low loss gate drive circuit that overcomes the foregoing disadvantages generally associated with conventional voltage source gate drive circuits.

SUMMARY

The embodiments of the present invention described herein provide a systematic approach for driving a power semiconductor switching device of a high frequency converter in a new and improved high speed low loss gate driver circuit. The new gate driver circuit comprises a full bridge configuration with an inductor connected between the mid points of the bridge. Two capacitors, Cpos and Cneg, connected in series, are coupled into the DC link of the bridge with a gate DC power supply Vc as an input. The low voltage switches are controlled in way that the gate driver circuit provides a programmable magnitude of the discharge current to turn the power switch device off fast enough to reduce turn-off switching loss and keep voltage overshoot in a safe limit A negative voltage bias is applied to the gate to maximize the dv/dt immunity for the power MOSFET when it is in an off state. The gate driver circuit provides a tunable turn-on current to match switching characteristics of other power devices used in a practical application. Furthermore, the gate driver circuit recovers turn-on/off gate energies stored in the input capacitance of the power switch to ensure a high frequency operation.

BRIEF DESCRIPTION

The above and further features and advantages of the present invention will become apparent when reading the detailed description of the preferred embodiments with the accompanying drawings in which.

DETAILED DESCRIPTION

The embodiments of the present invention described herein are directed to a new gate driver scheme that controls power semiconductor switches with high performance. More specifically, an embodied gate driver circuit provides a fast turn-off transient with reduced power switching losses and a controllable overshoot. The turn-on procedure matches switching characteristics of other power component in the power stage and maximizes dv/dt immunity with a negative voltage clamped to the gate when it is in an off state. Meanwhile, the gate driver losses are kept low to ensure a higher switching frequency operation.

Figure 1:
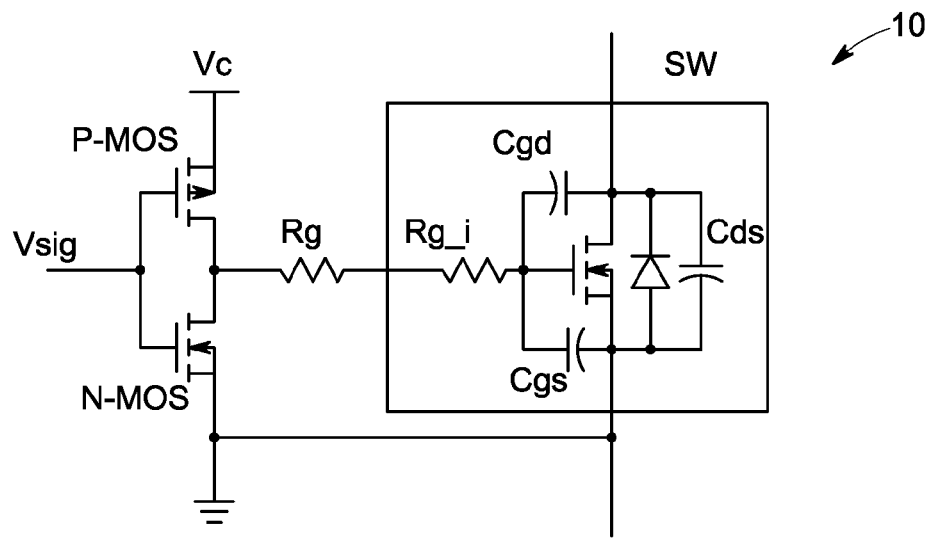
FIG. 1 is a conventional gate driver schematic diagram
Figure 2:
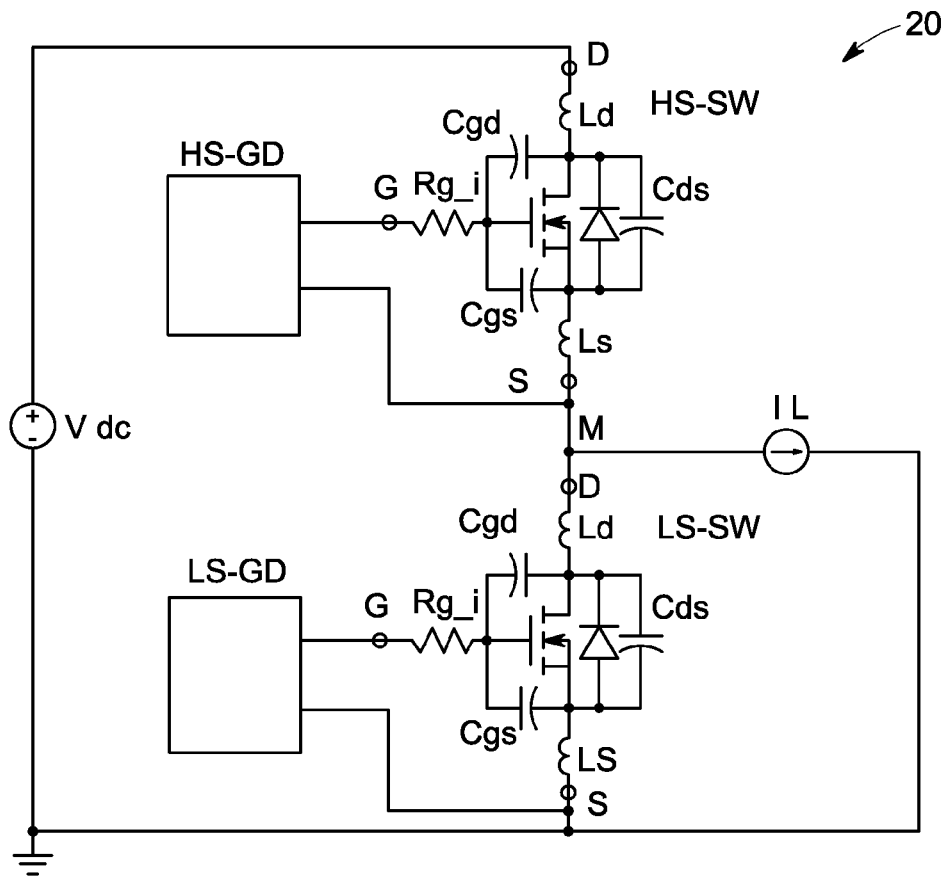
FIG. 2 is a schematic diagram of a half-bridge model with parasitic components.
Figure 3:
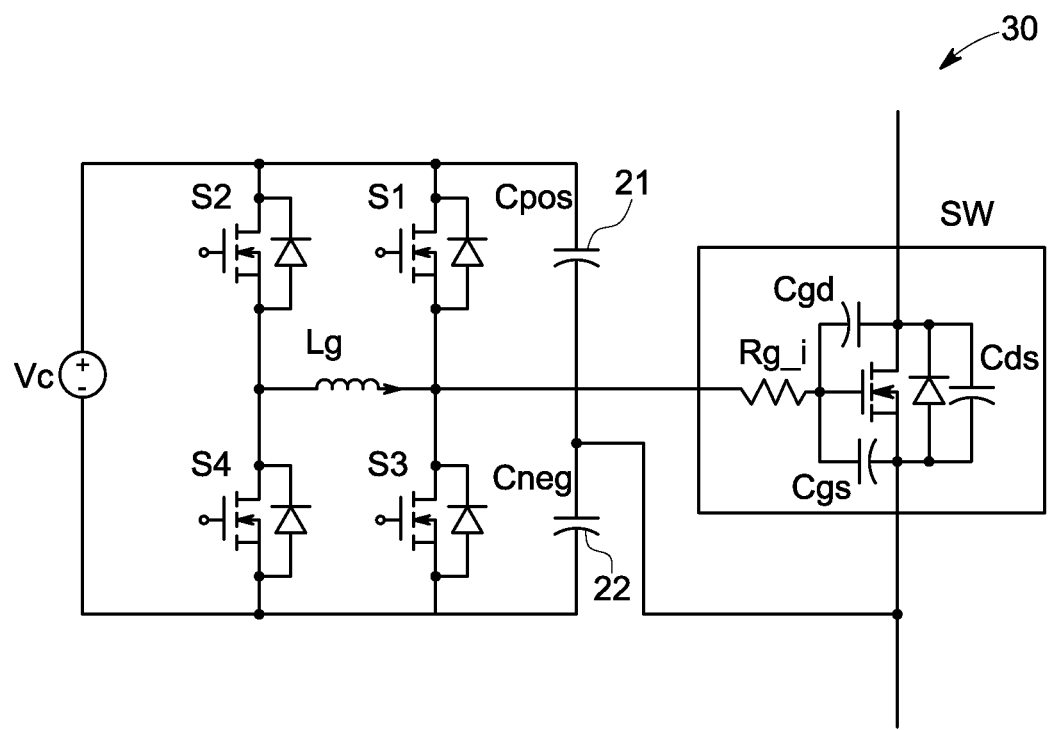
FIG. 3 is a circuit diagram of a gate driver circuit according to a preferred first embodiment of the present invention.

FIG. 3 is a circuit diagram of a gate driver circuit 30 according to a preferred first embodiment of the present invention. As shown in FIG. 3, two capacitors 21, 22 are connected in series forming a voltage divider. The voltage divider ratio could be simply determined by a high resistive resistor divider connected in parallel with the capacitor pair. These two capacitors 21, 22 preferably have a low ESR (equivalent series resistance) and a low ESL (equivalent series inductance) with a compact size, such as SM (surface mount) ceramic capacitors. The SM capacitor Cneg 22 and the low voltage MOSFET S3 are arranged closely, both physically and electrically, so that a loop area that is as small as possible is formed with the gate input capacitance of the power switch, to maximize the dv/dt immunity. The loop area formed by MOSFET S4, Lg, gate input capacitance and Cneg is less important in the electromagnetic susceptibility point of view, but it is favorable to make it small so that the high turn-off current transients are localized to reduce EMI noise generation. The loop formed by MOSFET S2, Lg, gate input capacitance and Cpos is mainly for the turn-on transient and it is also favorable to have a small area to confine EMI noise generation. Unlike a conventional gate driver circuit, the loop area formed by the MOSFET S1, Cpos and the gate input capacitance is not necessarily very tight, since the main function of this part of the circuit is to fully enhance the conducting channel of the power switch by applying a higher gate drive voltage.

Figure 4:
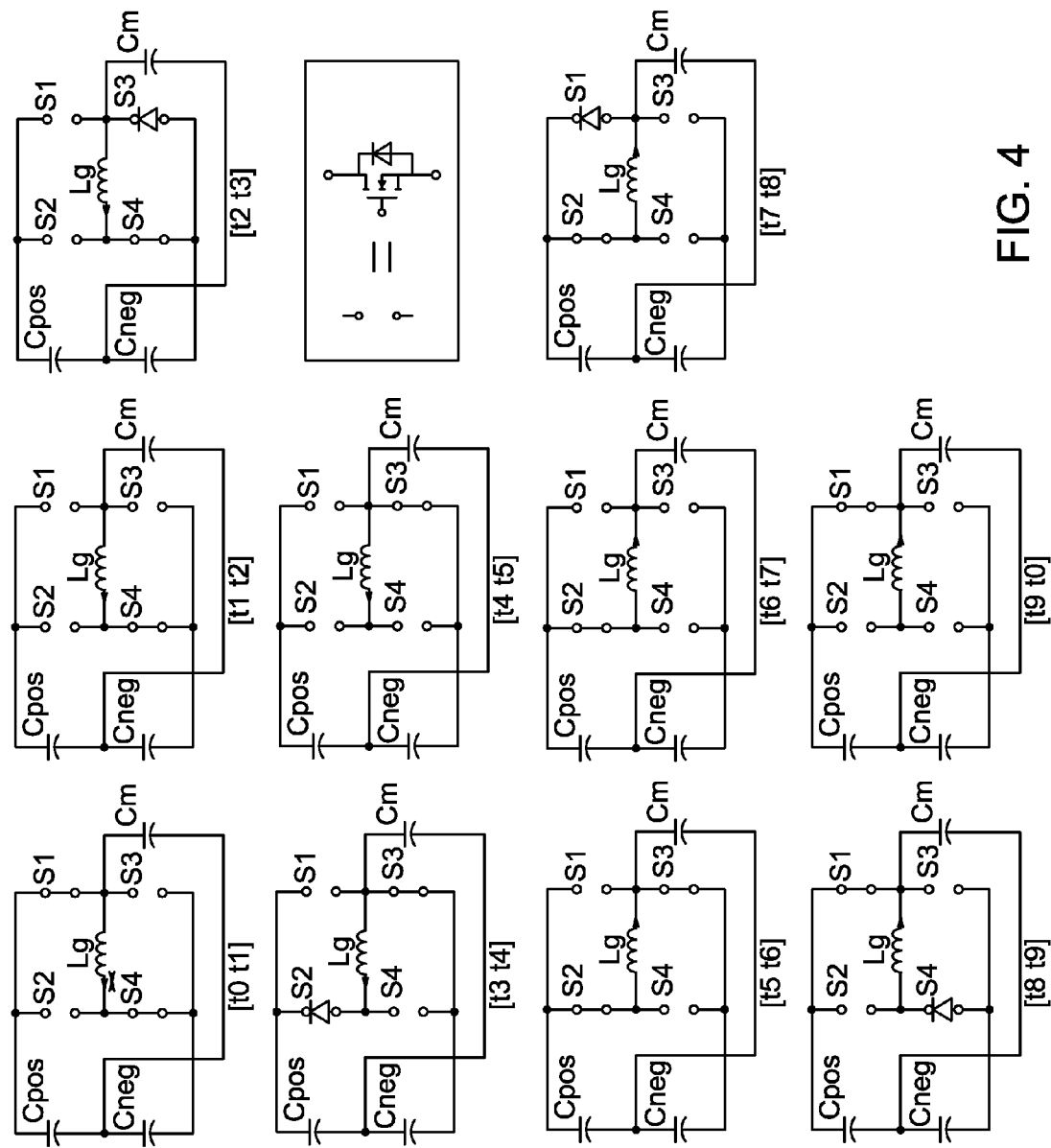
FIG. 4 is a topological stages showing a preferred operation of the preferred first embodiment of the present invention.
Figure 5:
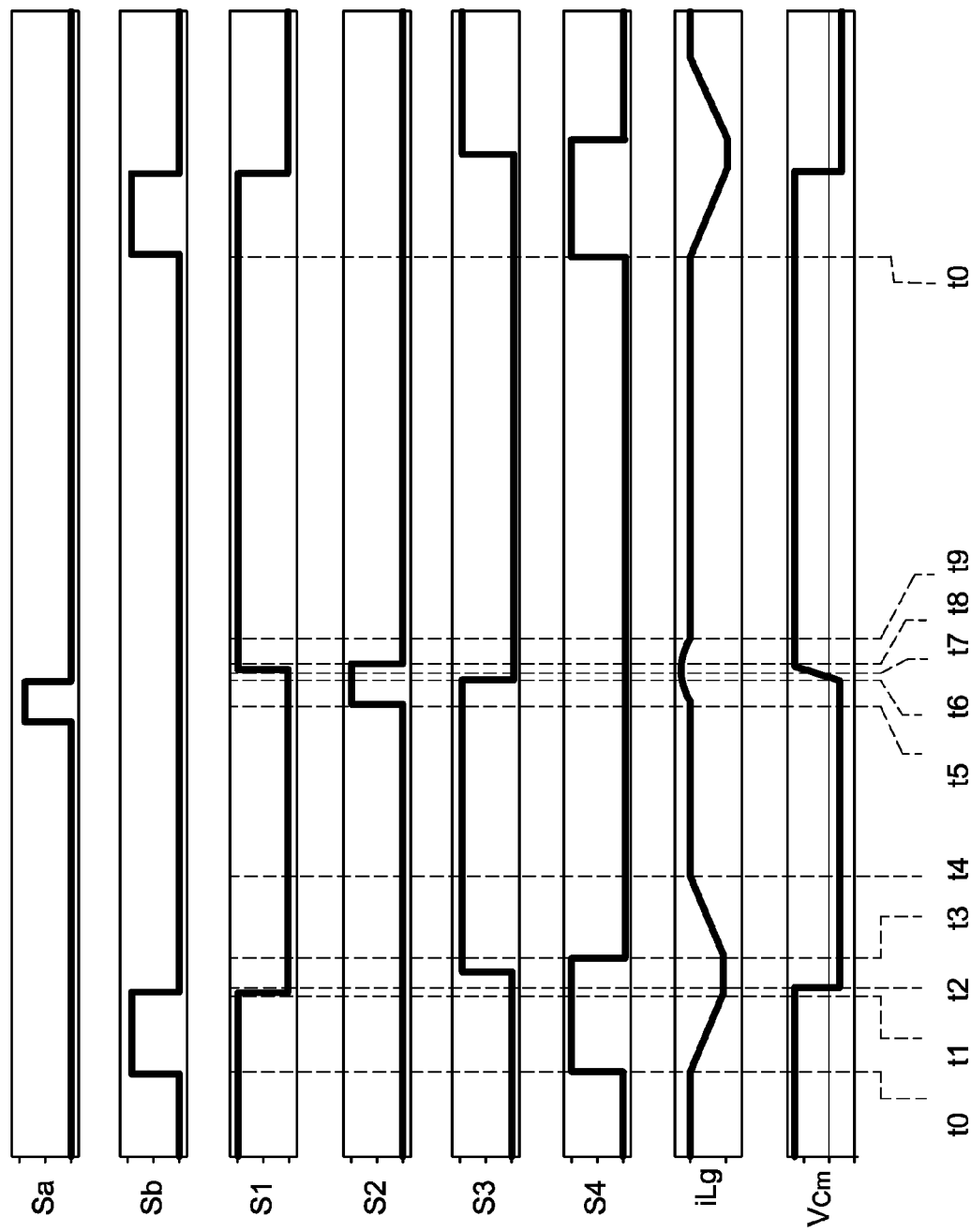
FIG. 5 is a timing diagram according to one embodiment of the present invention.

Referring to the topological stages and timing diagram shown in FIG. 4 and FIG. 5 respectively, the turn-off procedure begins with the turn-on of S4. With the turn-on of S4, a current is established through Lg that increases linearly with time until the magnitude reaches a preset value such that S1 is turned-off at time t1 [stage t0-t1]. With the turn-off of S1, the energy stored in Lg together with the voltage on Cneg 22 discharges the gate capacitor Cm rapidly so that the power switch transverses a turn-on delay, wherein a Miller plateau period and linear interval speedily precede the fully turn-off stage [stage t1-t2]. The high discharging current helps alleviate the di/dt induced voltage overshoot by deviating Id through $C_{GD}$. The body diode of MOSFET S3 is forced on when the gate voltage reaches the voltage on Cneg 22, ensuring that the current $i_{Lg}$ is freewheeling in the loop formed by S4 and S3 [stage t2-t3]. S3 is turned-on any time during this stage. This stage ends with the turn-off of S4 causing inductor energy recovery back to the power supply [stage t3-t4]. The inductor current reduces linearly until it reaches zero at time t4. Since S3 has turned-on previously, the gate input is firmly clamped by Cneg 22, and a positive gate-to-source voltage cannot be established even under severe dv/dt conditions [stage t4-t5]. The gate driver circuit 30 remains in this stage until a control signal instructs the turn-on procedure at t5. At time t5, MOSFET S2 is turned on establishing a current through Lg [stage t5-t6]. With the turn-off of S3, the energy stored in Lg together with Cpos 21 operate to charge the gate input Cm so that the power switch is turned on [stage t6-t7]. Under a hard switched clamped inductive power converter application, an optimum design solution would match the diode switching characteristic without over speeding the turn-on procedure; under most resonant and soft witching applications, the turn-on speed would be less of a concern as long as it turns on the power switch in time since the drain-to-source voltage is practically zero, making the Miller effect disappear. The body diode of S1 is turned on when the gate voltage reaches Vcpos, freewheeling the inductor current [stage t7-t8]. This stage ends when S2 is turned off, recycling inductor energy back to the gate power supply [stage t8-t9]. When the inductor current drops to zero, the body diode of S4 is turned off and completes a switching cycle [stage t9-t0].

Figure 6:
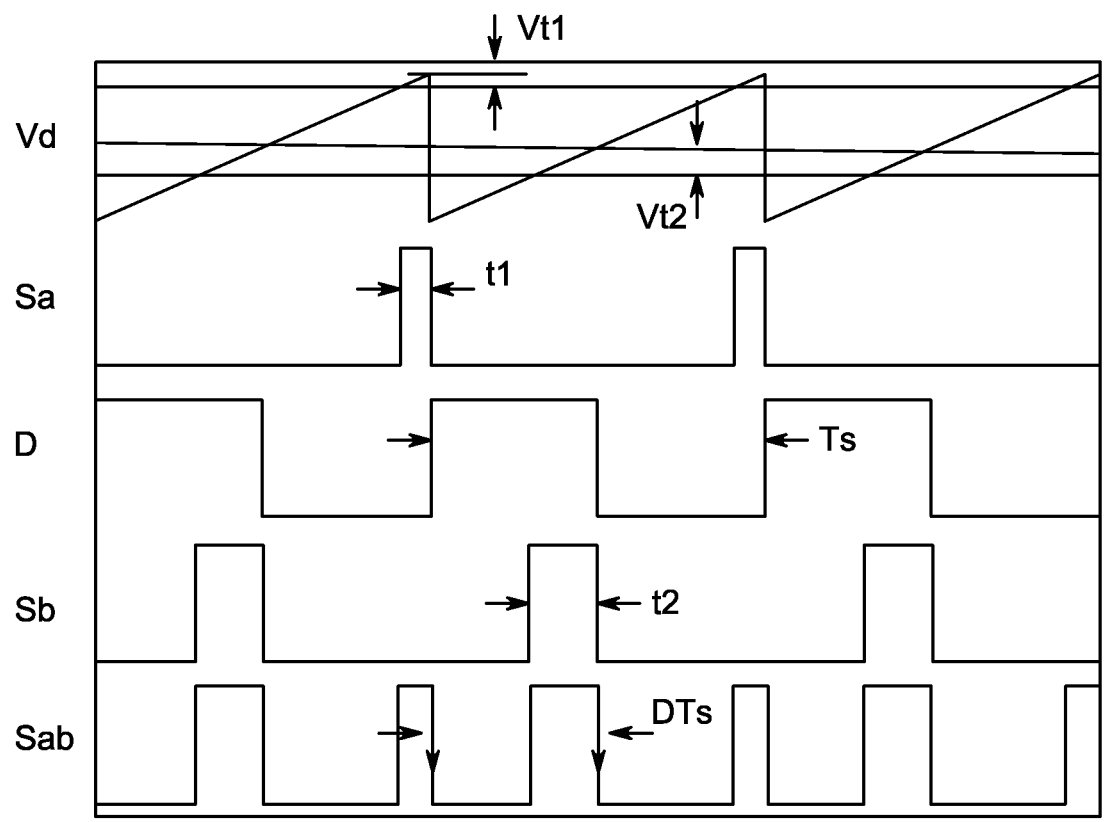
FIG. 6 is an exemplary scheme of duty ratio control according to one embodiment of the present invention.

It becomes clear that the timing for the MOSFETs S1 to S4 is essential for a proper operation. It is important not to alter a normal PWM control or other control method used with a conventional gate driver circuit. FIG. 6 illustrates an exemplary scheme of duty ratio control according to one embodiment of the present invention. The exemplary scheme depicts generation of the control timing from a typical PWM controller. Vd is a control voltage output for comparing a rising ramp saw-tooth PWM carrier that determines the duty ratio D. Voltages Vt1 and Vt2 generate two control signals Sa and Sb, respectively. Accordingly, the time duration of t1 and t2 is proportional to the voltage magnitude of Vt1 and Vt2, where Vt1 is the voltage difference from the carrier magnitude and Vt1 is the voltage difference from the Vd. Therefore, the falling edge of Sa and Sb defines the PWM duty ratio, and now it is very easy to generate S1 to S4 from Sab (a combination of Sa and Sb) with a simple logic circuit. As already described herein, the duration of Sb determines the turn-off discharging current magnitude while the duration of Sa determines the turn-on charging current magnitude. A feedback mechanism may be introduced to dynamically control the turn-off/-on procedure of the gate drive circuit 30 by changing the magnitude of Vt1 and/or Vt2. Now the gate drive circuit 30 becomes a closed loop with a power stage that achieves superior performance beyond that achievable by a more conventional gate driver circuit. It should be noted, the embodied scheme is easily adapted for use with a falling ramp saw-tooth PWM, a symmetrical PWM and a digital PWM as well.

Figure 7:
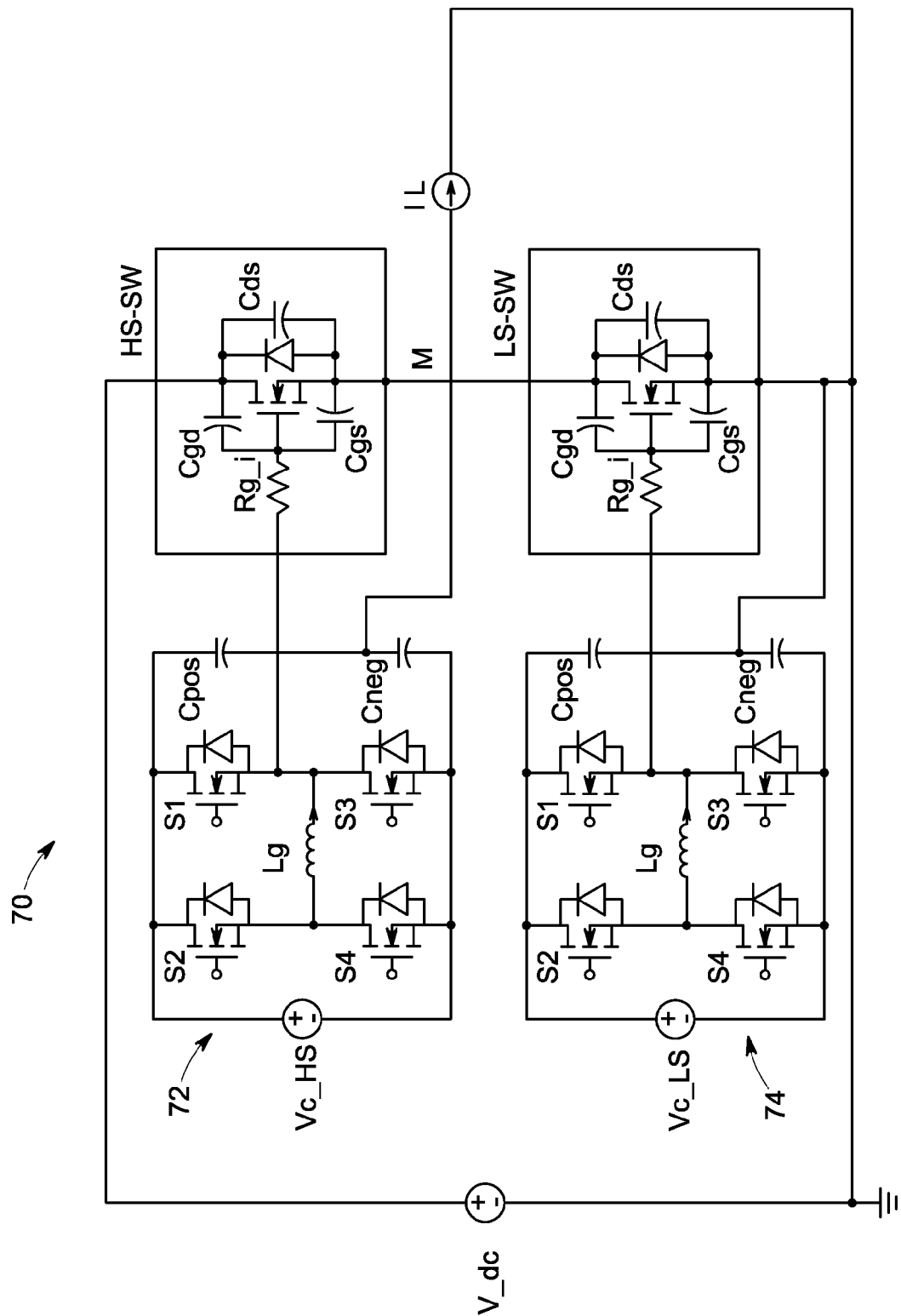
FIG. 7 is a circuit diagram showing the gate driver circuits used in a half-bridge configuration.

FIG. 7 illustrates an exemplary gate driver circuit topology when the embodied gate driver is used in a half-bridge configuration 70. These two gate drive circuits 72, 74 operate in harmony using the principles described herein to ensure a best match for respective speed and dv/dt immunity under all operating condition with lowest switching losses possible.

Figure 8:
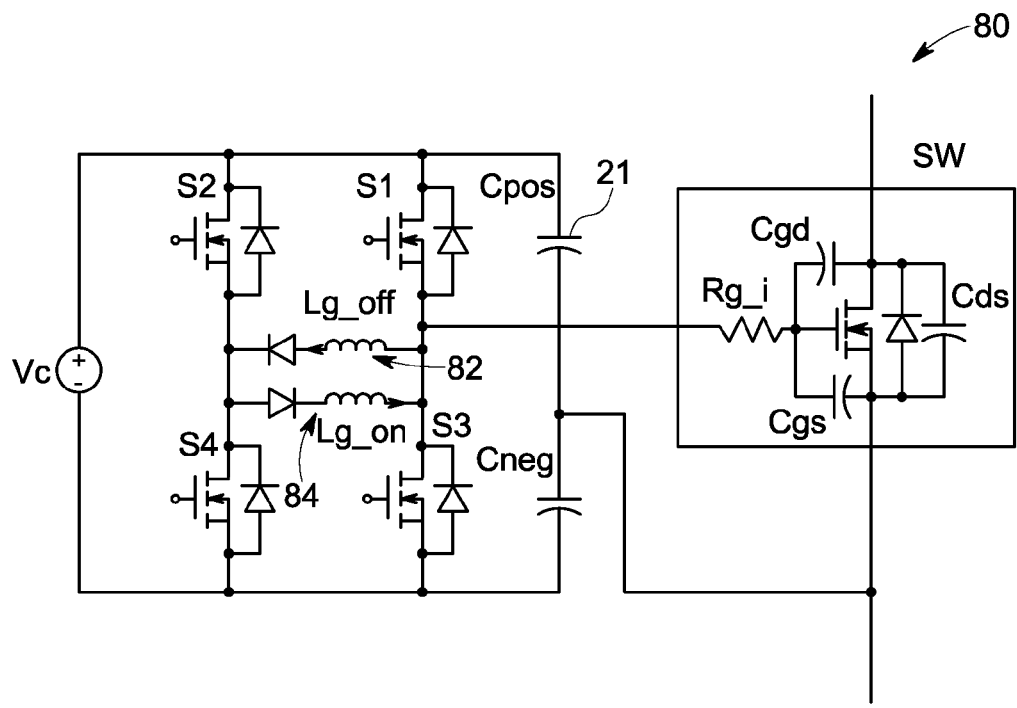
FIG. 8 is a circuit diagram according to a second embodiment of the invention.
Figure 9:
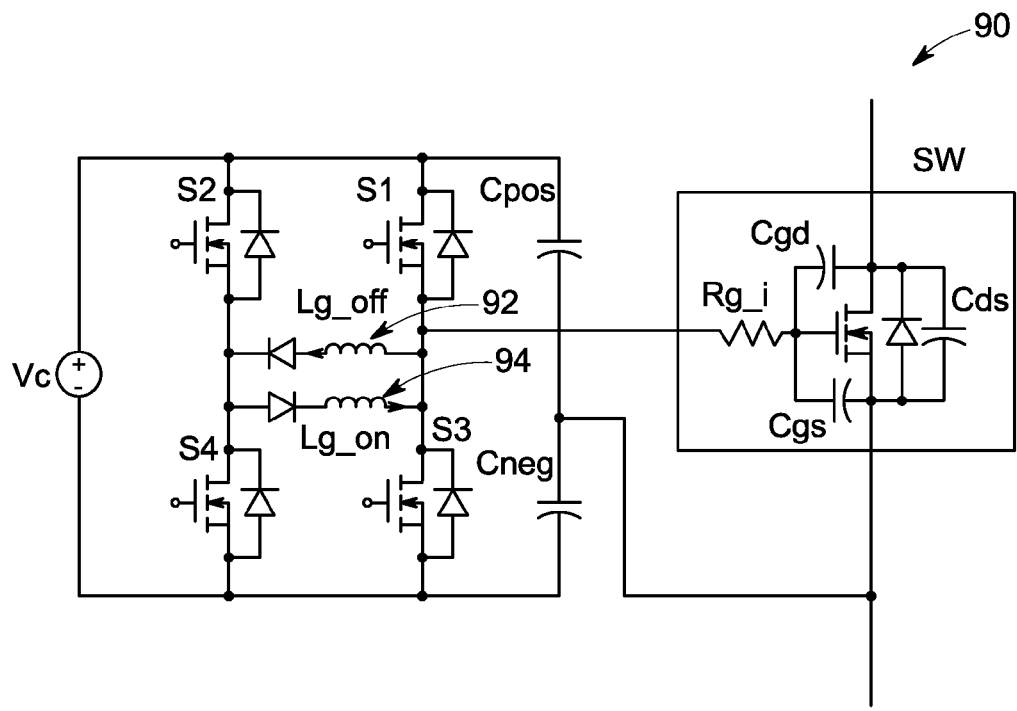
FIG. 9 is a circuit diagram according to a third embodiment of the invention.

FIG. 8 and FIG. 9 illustrate gate driver circuit embodiments 80 and 90 respectively. Gate driver circuits 80, 90 use asymmetrical discharging/charging inductance 82, 84 and 92, 94 respectively to again provide fast turn-off speed and turn-on with an added flexibility.

Figure 10:
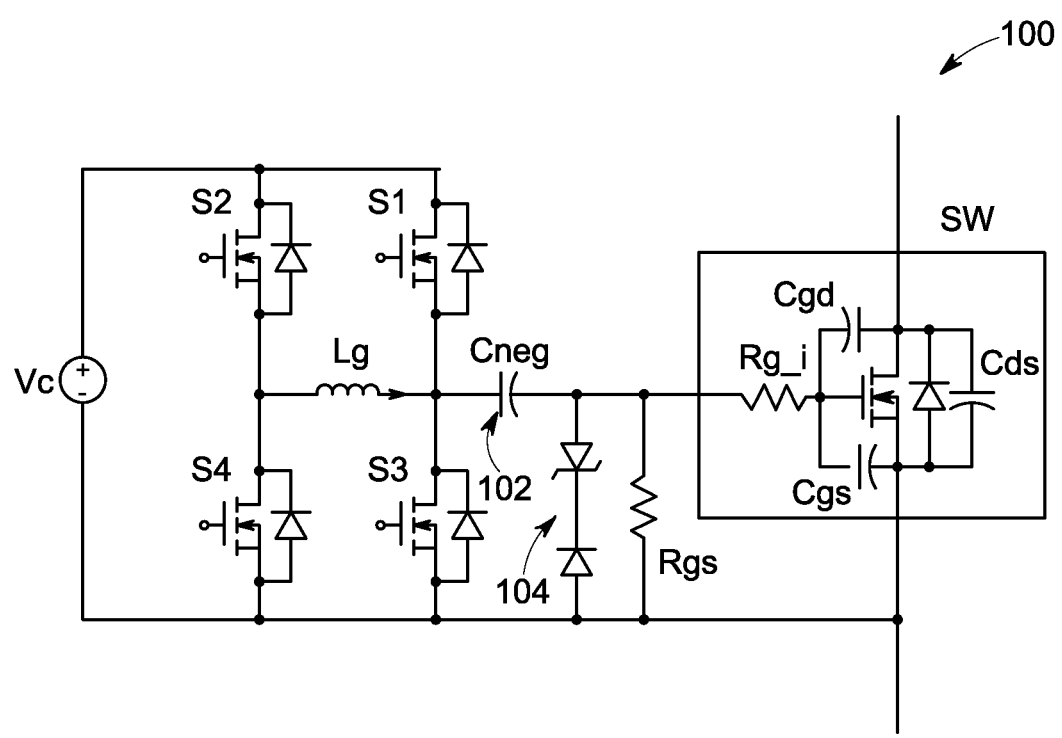
FIG. 10 is a circuit diagram according to a fourth embodiment of the invention.

FIG. 10 illustrates another gate drive circuit embodiment 100, where a negative voltage is generated with Cneg 102 and a zener+diode branch 104.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A gate drive circuit comprising:
   a first full bridge semiconductor switching circuit comprising a dc link and a pair of semiconductor switching device legs connected to the dc link, each switching device leg comprising a mid point;
   a gate dc power supply connected as an input voltage source to the dc link;
   a capacitive voltage divider comprising a plurality of series connected capacitors forming an intermediate voltage connection point, a positive voltage connection point connected to the dc link, and a negative voltage connection point connected to the dc link;
   at least one inductor connecting the mid points of the switching device legs; and
   a power semiconductor switch comprising a gate terminal connected to the at least one inductor to provide a programmable current source to the gate terminal of the power semiconductor switch, the power semiconductor switch further comprising a gate capacitance coupling the gate of the power semiconductor switch to the intermediate voltage connection point of the capacitive voltage divider.

2. The gate drive circuit according to claim 1, wherein the power semiconductor switch comprises a MOSFET device.

3. The gate drive circuit according to claim 1, wherein the power semiconductor switch comprises a thyristor device.

4. The gate drive circuit according to claim 1, wherein the power semiconductor switch comprises an insulated gate semiconductor device.

5. The gate drive circuit according to claim 1, wherein the full bridge semiconductor switching circuit comprises at least one semiconductor body diode.

6. The gate drive circuit according to claim 1, further comprising a programmable switch controller configured to control switching event timing for the full bridge semiconductor switching circuit so as to control the magnitude of the power semiconductor device gate current flow such that gate voltage overshoot is constrained to a first predetermined limit and further such that power semiconductor device turn-off switching losses are constrained within a second predetermined limit.

7. The gate drive circuit according to claim 1, wherein the plurality of series connected capacitors comprise surface mount (SM) capacitors.

8. The gate drive circuit according to claim 7, wherein at least one SM capacitor is arranged closely both physically and electrically to at least one full bridge semiconductor switching device to minimize a loop area with the gate input capacitance of the power semiconductor switch so as to maximize its dv/dt immunity.

9. The gate drive circuit according to claim 1, further comprising a semiconductor diode connected in series with each inductor.

10. The gate drive circuit according to claim 1, wherein no more than one inductor is connected in series with a semiconductor diode when the gate drive circuit comprises more than one inductor connecting the mid points of the switching device legs.

11. The gate drive circuit according to claim 1, further comprising a second full bridge semiconductor switching circuit, wherein the first full bridge semiconductor switching circuit and the second full bridge semiconductor switching circuit are each configured as a half bridge portion of a third full bridge semiconductor switching circuit.

12. The gate drive circuit according to claim 1, further comprising a capacitor connecting the at least one inductor to the gate terminal and a zener plus diode branch connecting the gate terminal to the dc link.

13. A gate drive circuit comprising:
an insulated gate power semiconductor switch comprising a gate terminal and an internal gate capacitance; and
a controlled current source connected to the gate terminal to control the magnitude of the power semiconductor device gate current flow in response to recycled gate charge flowing from the internal gate capacitance,
wherein the controlled current source comprises a first full bridge semiconductor switching circuit comprising a dc link and a pair of semiconductor switching device legs connected to the dc link, each switching device leg comprising a mid point;
a gate dc power supply connected as an input voltage source to the dc link;
a capacitive voltage divider comprising a plurality of series connected capacitors forming an intermediate voltage connection point, a positive voltage connection point connected to the dc link, and a negative voltage connection point connected to the dc link; and
at least one inductor connecting the mid-points of the switching device legs, wherein the at least one inductor is connected to the gate terminal and the internal gate capacitance is connected to the intermediate voltage connection point.

14. The gate drive circuit according to claim 13, wherein the semiconductor switch comprises at least one of a MOSFET device, an IGBT device, and a thyristor device.

15. The gate drive circuit according to claim 13, wherein the first full bridge semiconductor switching circuit comprises at least one semiconductor body diode.

16. The gate drive circuit according to claim 13, further comprising a programmable switch controller configured to control switching event timing for the first full bridge semiconductor switching circuit so as to control the magnitude of the power semiconductor device gate current flow such that gate voltage overshoot is constrained to a first predetermined limit and further such that power semiconductor device turn-off switching losses are constrained within a second predetermined limit.

17. The gate drive circuit according to claim 13, wherein the plurality of series connected capacitors comprise surface mount (SM) capacitors.

18. The gate drive circuit according to claim 17, wherein at least one SM capacitor is arranged closely both physically and electrically to at least one first full bridge semiconductor switching device to minimize a loop area with the gate input capacitance of the power semiconductor switch so as to maximize its dv/dt immunity.

19. The gate drive circuit according to claim 13, further comprising a semiconductor diode connected in series with each inductor.

20. The gate drive circuit according to claim 13, wherein no more than one inductor is connected in series with a semiconductor diode when the gate drive circuit comprises more than one inductor connecting the mid points of the switching device legs.

21. The gate drive circuit according to claim 13, further comprising a second full bridge semiconductor switching circuit, wherein the first full bridge semiconductor switching circuit and the second full bridge semiconductor switching circuit are each configured as a half bridge portion of a third full bridge semiconductor switching circuit.

22. The gate drive circuit according to claim 13, further comprising a capacitor connecting the at least one inductor to the gate terminal and a zener plus diode branch connecting the gate terminal to the dc link.

* * * * *